United States Patent
Achuthan et al.

(10) Patent No.: US 6,498,397 B1
(45) Date of Patent: Dec. 24, 2002

(54) SEED LAYER WITH ANNEALED REGION FOR INTEGRATED CIRCUIT INTERCONNECTS

(75) Inventors: Krishnashree Achuthan, San Ramon, CA (US); Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/848,979

(22) Filed: May 4, 2001

Related U.S. Application Data

(60) Provisional application No. 60/246,300, filed on Nov. 6, 2000.

(51) Int. Cl.[7] .................. H01L 23/48; H01L 23/52; H01L 29/40
(52) U.S. Cl. ............... 257/758; 257/751; 257/752; 257/762; 438/627; 438/643; 438/653; 438/927
(58) Field of Search .................... 257/758, 751, 257/752, 762; 438/627, 643, 653, 927

(56) References Cited

U.S. PATENT DOCUMENTS

| | | | | |
|---|---|---|---|---|
| 4,680,612 A | * | 7/1987 | Hieber et al. | 257/751 |
| 4,985,750 A | * | 1/1991 | Hoshino | 257/751 |
| 4,990,997 A | * | 2/1991 | Nishida | 257/751 |
| 5,432,125 A | * | 7/1995 | Misawa et al. | 438/176 |
| 6,093,966 A | * | 7/2000 | Venkatraman et al. | 257/751 |
| 6,130,156 A | * | 10/2000 | Havemann et al. | 438/637 |
| 6,136,682 A | * | 10/2000 | Hegde et al. | 438/622 |
| 6,140,234 A | * | 10/2000 | Uzoh et al. | 438/678 |
| 6,181,012 B1 | * | 1/2001 | Edelstein et al. | 257/762 |
| 6,281,121 B1 | * | 8/2001 | Brown et al. | 257/758 |
| 6,331,484 B1 | * | 12/2001 | Bhowmik et al. | 257/751 |

* cited by examiner

*Primary Examiner*—David Nelms
*Assistant Examiner*—Andy Huynh
(74) *Attorney, Agent, or Firm*—Mikio Ishimaru

(57) ABSTRACT

An integrated circuit and manufacturing method therefor is provided having a semiconductor substrate with a semiconductor device. A dielectric layer is on the semiconductor substrate and has an opening provided therein. An barrier layer lines the opening and a seed layer is deposited to line the barrier layer. A conductor core fills the opening over the barrier layer to form a conductor channel. The seed layer is annealed to form an annealed region, which securely bonds the seed layer to the barrier layer and prevents electromigration along the surface between the seed and barrier layers.

8 Claims, 2 Drawing Sheets

SEED LAYER WITH ANNEALED REGION FOR INTEGRATED CIRCUIT INTERCONNECTS

CROSS-REFERENCE TO RELATED APPLICATION(S)

This application claims the benefit of U.S. Provisional patent application Ser. No. 60/246,300 filed Nov. 6, 2000.

TECHNICAL FIELD

The present invention relates generally to semiconductor technology and more specifically to seed materials in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "cap" layer and a "single" damascene process is completed. When the layer is processed further for placement of additional channels over it, the layer is a via stop layer.

The via formation step of the dual damascene process begins with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "cap" layer and the "dual" damascene process is completed.

The layer may be processed further for placement of additional levels of channels and vias over it.

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem occurs at the interface between the barrier and the conductor materials because the bonding is not very strong, and this permits atomic movement of conductor material, or electromigration (EM), due to current flow to occur which results in void formation along the barrier layer and seed layer. This surface EM is particularly problematic with copper conductors and causes these voids to occur in different locations, but most often in the vias, and leads to open circuits.

Solutions to this problem has been long sought but has long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A barrier layer lines the opening and a seed layer is deposited to line the barrier layer. A conductor core fills the opening over the barrier layer to form a conductor channel. The seed layer is securely bonded to the barrier layer by an annealed surface, which prevents electromigration along the surface between the seed and barrier layers.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening and is amorphized. A seed layer is deposited on the barrier layer and securely bonds to the barrier layer. A conductor layer is deposited to fill the channel opening over the barrier layer. A planarization technique is used to planarize the barrier, seed, and conductor layers to be coplanar with the dielectric layer to form a conductor channel. The seed layer is securely bonded to the barrier layer in an annealing process, which prevents electromigration along the surface between the seed and barrier layers.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
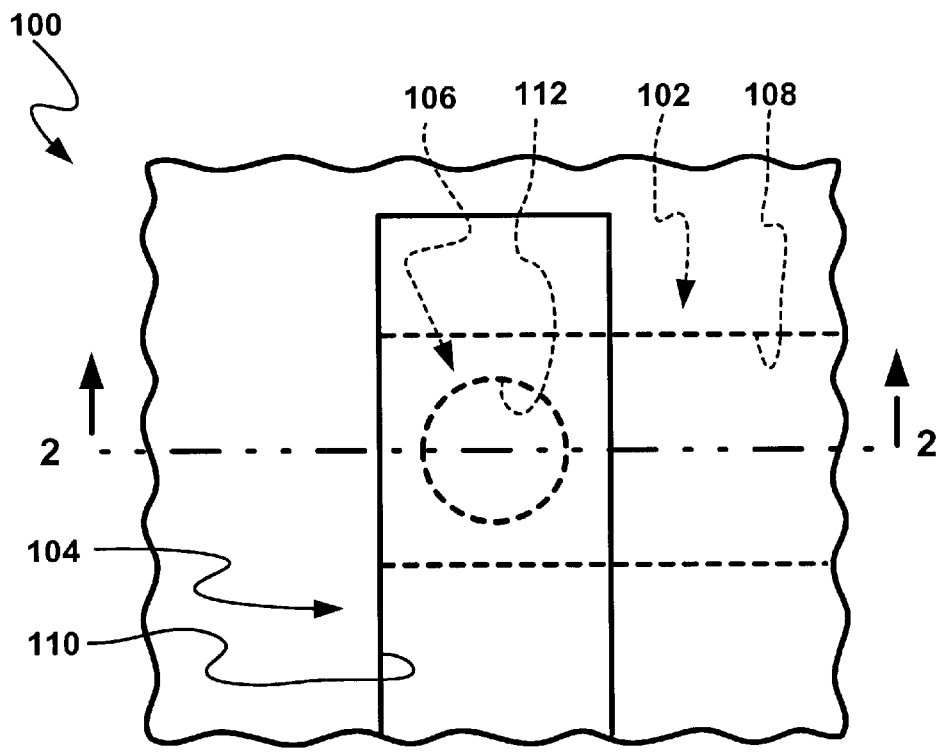
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
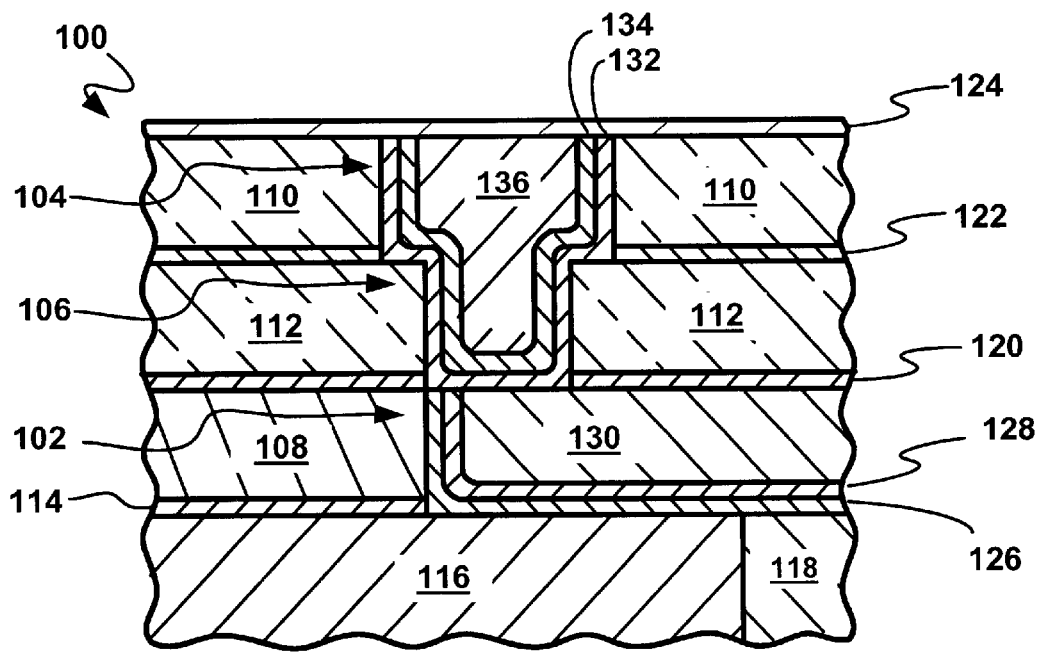
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material of the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

In the past, for copper conductor material and seed layers, highly resistive diffusion barrier materials such as tantalum nitride (TaN), titanium nitride (TiN), or tungsten nitride (WN) were used as barrier materials to prevent diffusion. The interface between the barrier materials and copper would not form a strong bond and created weak points for surface electromigration to occur along the surface between the barrier layer and the seed layer. This surface electromigration was particularly problematic with copper conductors and caused these voids to occur in different locations, but most often in the vias, and led to open circuits.

Figure 3:
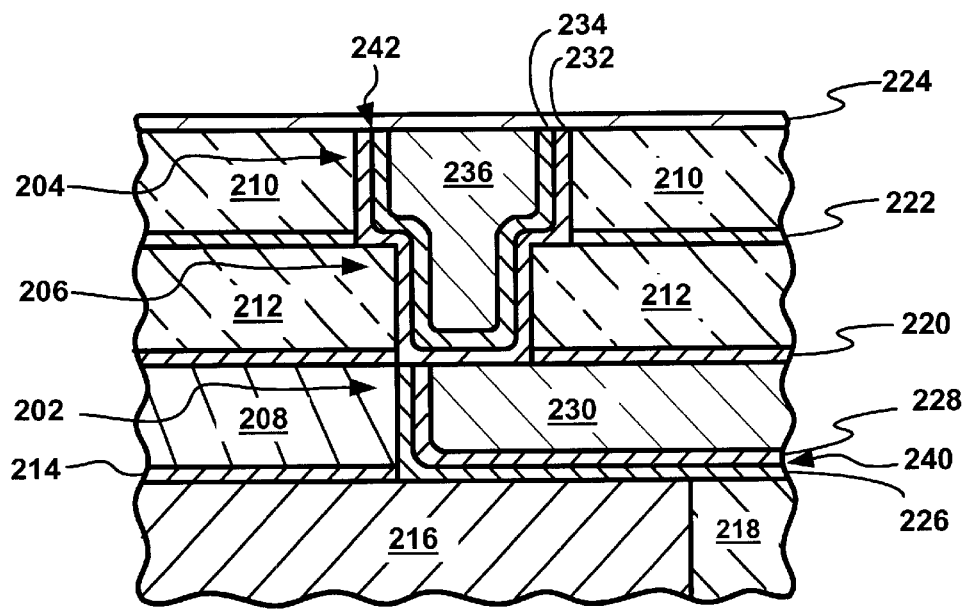
FIG. 3 is a cross-section showing the barrier layer of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition. The seed layers 228 and 234 are deposited and annealed so as to interlock with the barrier layers 226 and 232, respectively, in annealed seed regions 240 and 242, respectively, so as to prevent surface electro-migration.

Figure 4:
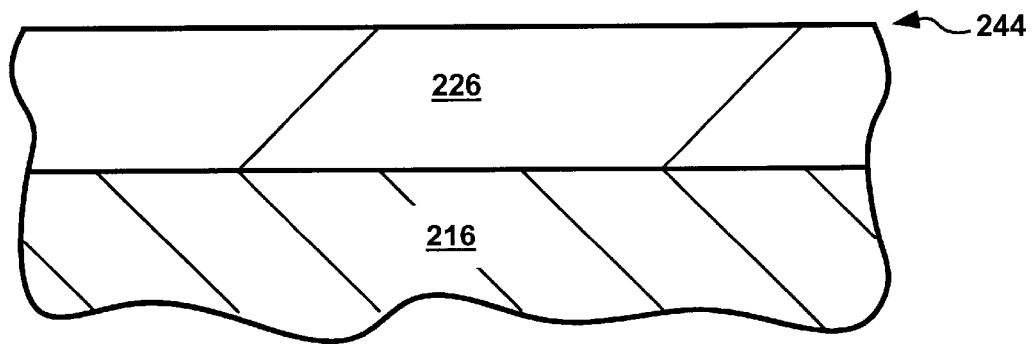
FIG. 4 is close-up of FIG. 3 of the barrier layer after deposition in accordance with the resent invention.

Referring now to FIG. 4, therein is shown a close-up of FIG. 3 after deposition of the barrier layer 226 in accordance with the present invention. The barrier layer 226 is deposited by a process such as chemical vapor deposition or sputtering over silicon substrate of the wafer 200 on the device dielectric layer 216. The barrier layer 226 is deposited with substantially planar upper and side surfaces, as exemplified by the smooth surface 244.

After deposition, the seed layer 228 is deposited on the barrier layer 226 by a process such as physical vapor deposition or ionized metal plasma deposition, which leaves a smooth surface therebetween.

Figure 5:
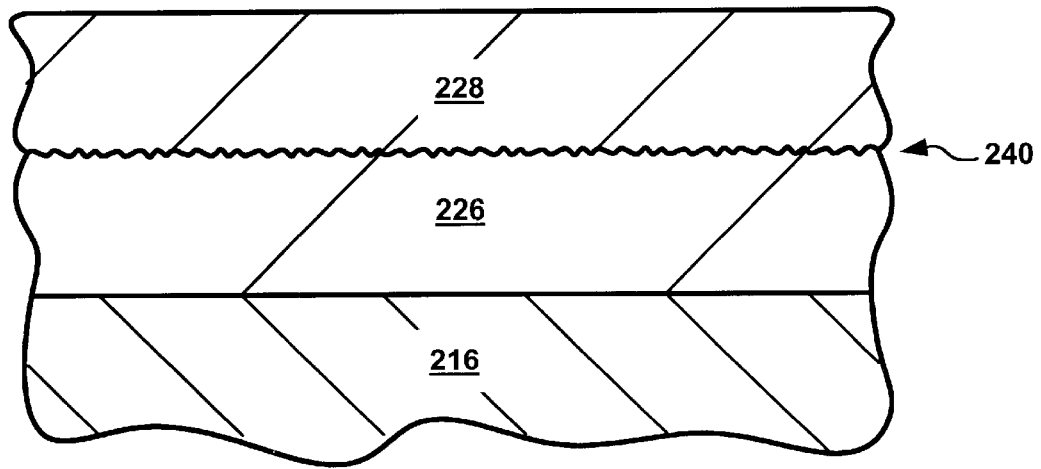
FIG. 5 is FIG. 4 after deposition and anneal of the seed layer in accordance with the present invention.

Referring now to FIG. 5, therein is shown FIG. 4 after deposition and anneal of the seed layer 228 in accordance with the present invention. After deposition, the seed layer 228 is subjected to an anneal up to 400° C. for up to one hour followed by rapid cooling at a rate of more than 1° C. per second. Due to the mobility of the atoms of the conductor of the seed layer 228 during anneal, the smooth surface between the seed layer 228 and the barrier layer 226 will be roughened to interlock and form the annealed seed region 240 which is under 25% of the thickness of the seed layer 228.

As would be evident to those skilled in the art, the step at which the anneal is performed is not critical. The anneal may be performed after the deposition of each seed layer, after the deposition of the conductor cores, after one or more levels of interconnects, etc.

In various embodiments, the barrier layers are of materials such as tantalum (Ta), titanium (Ti), tungsten (W), compounds thereof, and combinations thereof The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. An integrated circuit comprising:
   a semiconductor substrate having a semiconductor device provided thereon;
   a dielectric layer formed on the semiconductor substrate having an opening provided therein;
   a barrier layer lining the opening;
   a seed layer lining the barrier layer, said seed layer having an annealed region whereby the seed layer and barrier layer are interlocked; and
   a conductor core filling the opening and connected to the semiconductor device.

2. The integrated circuit as claimed in claim 1 wherein the annealed region is to a depth of under 25% of the thickness of the seed layer.

3. The integrated circuit as claimed in claim 1 wherein the barrier layer is of a material from a group consisting of tantalum, titanium, tungsten, an alloy thereof, and a compound thereof.

4. The integrated circuit as claimed in claim 1 wherein the seed layer contains a material from a group consisting of copper, aluminum, gold, silver, an alloy thereof, and a compound thereof.

5. An integrated circuit comprising:
   a silicon substrate having a semiconductor device provided thereon,
   a device oxide layer formed on the silicon substrate;
   a channel oxide layer formed on the device oxide layer having a channel opening provided therein;
   a barrier layer lining the channel opening;
   a seed layer lining the barrier layer, said seed layer having an annealed region whereby the seed layer and barrier layer are interlocked; and
   a conductor core filling the channel opening and connected to the semiconductor device, the conductor core over the barrier layer.

6. The integrated circuit as claimed in claim 5 wherein the annealed region is to a depth of under 25% of the thickness of the seed layer.

7. The integrated circuit as claimed in claim 5 wherein the barrier layer is of a material from a group consisting of tantalum, titanium, tungsten, an alloy thereof, and a compound thereof.

8. The integrated circuit as claimed in claim 5 wherein the conductor core contains a material from a group consisting of copper, aluminum, gold, silver, an alloy thereof, and a compound thereof.

* * * * *